United States Patent
Chen

(10) Patent No.: US 7,639,024 B2
(45) Date of Patent: Dec. 29, 2009

(54) RESISTANCE COMPENSATION CIRCUIT AND METHOD THEREOF

(75) Inventor: Te-Wei Chen, Chupei (TW)

(73) Assignee: Siliconmotion Inc., Hsinchu County (TW)

( * ) Notice: Subject to any disclaimer, the term of this patent is extended or adjusted under 35 U.S.C. 154(b) by 422 days.

(21) Appl. No.: 11/595,888

(22) Filed: Nov. 13, 2006

(65) Prior Publication Data

US 2008/0024146 A1    Jan. 31, 2008

(30) Foreign Application Priority Data

Jul. 25, 2006    (TW) .............................. 95127174 A

(51) Int. Cl.
*G05B 24/02*    (2006.01)
*G01R 27/02*    (2006.01)
(52) U.S. Cl. .................... 324/720; 324/691; 323/354
(58) Field of Classification Search ............... 324/720, 324/691, 354
See application file for complete search history.

(56) References Cited

U.S. PATENT DOCUMENTS

| | | | | |
|---|---|---|---|---|
| 5,045,832 | A | * | 9/1991 | Tam ............................ 338/334 |
| 5,172,125 | A | * | 12/1992 | Peregrim et al. ............ 342/154 |
| 5,993,060 | A | | 11/1999 | Sakurai |
| 6,791,610 | B1 | * | 9/2004 | Butler et al. ................ 348/297 |
| 7,265,560 | B2 | * | 9/2007 | West et al. .................. 324/721 |

FOREIGN PATENT DOCUMENTS

CN            1214526            4/1999

\* cited by examiner

*Primary Examiner*—Timothy J Dole
*Assistant Examiner*—John Zhu
(74) *Attorney, Agent, or Firm*—Rosenberg, Klein & Lee

(57) ABSTRACT

A resistance compensation circuit and a method thereof for tuning frequency, includes several resistors serially connected to one another, several transistors, each of which connects across one of the corresponding resistances, and a register electrically connected to the gates of the transistors. A control signal controls the switching of the transistors either to compensate the process variation of the resistance through the register or to tune the working frequency of the Integrated circuit.

6 Claims, 4 Drawing Sheets

RESISTANCE COMPENSATION CIRCUIT AND METHOD THEREOF

RELATED APPLICATIONS

The present application is based on, and claims priority from, Taiwan Application Serial Number 95127174, filed Jul. 25, 2006, the disclosure of which is hereby incorporated by reference herein in its entirety.

BACKGROUND

1. Field of Invention

The present invention relates to a resistance compensation circuit and the method thereof. More particularly, the present invention relates to a resistance compensation circuit and method thereof used in a memory controller.

2. Description of Related Art

In the process of making an integrated circuit, process variations may cause the integrated circuit to have incorrect resistance resulting in a resistance variation. The resistance variation of the integrated circuit makes the value of the current inaccurate during operation such that the circuit cannot work properly. For example, if an oscillator has a resistance variation during the process, the resonance frequency is inaccurate. To solve the problem, some compensation resistors and trimming pads are added to the conventional integrated circuit to compensate for the resistances in the case of resistance variation.

FIG. 1 shows a conventional integrated circuit, an oscillator 100 for example. As shown in FIG. 1, the band gap 101 provides reference voltage to the operation amplifier 103. The output of the operation amplifier 103 connects to an original resistor 105, and the resistance compensation circuit 115 is used to compensate for the resistance variation of the original resistor 105. The original resistor 105 and the compensation resistors 107a, 107b, and 107c are connected in series; the conducting wire 111a, 111b and 111c connect across the corresponding resistors individually; the trimming pads 109a, 109b and 109c are disposed on the corresponding conducting wires 111a, 111b and 111c individually.

If the original resistor 105 does have resistance variation so that resistance of the original resistor 105 is not the one required by the oscillator 100, the trimming pads 109a, 109b and 109c are used to select the compensation resistors to compensate for the resistance of the original resistor 105. For example, after the oscillator 100 has been manufactured, a test procedure measures all of the resistance after the process (including resistances of the resistors 105, 107a, 107b and 107c) to decide which resistor is needed. If we choose the compensation resistor 107a to compensate the resistance variation of the original resistor 105, trimming pad 109a is cut off and the trimming pad 109b, 109c are preserved such that the equivalent resistance will be the sum of the processed resistance of original resistor 105 and the processed resistance of the compensate resistor 107a.

However, due to the large area (about 40×40 um²) required by the trimming pads 109a, 109b, and 109c of the resistance compensation circuit 115, compensation resistors cannot be added sufficiently under the area limitations, such that the equivalent resistance after compensation cannot be accurate enough. In addition, once the trimming pad has been cut off, the resonance frequency of the oscillator 100 cannot be changed again. Therefore, this kind of oscillator 100 cannot work with nonvolatile memories of different frequencies.

For the foregoing reasons, there is a need for a new resistance compensation circuit and method thereof to reduce the area required by the conventional resistance compensation circuit; there is also a need for a new resistance compensation circuits and methods thereof to make the equivalent resistance more accurate after compensation; there is also a need for a new frequency tuning method to improve the performance of the integrated circuit.

SUMMARY

According to one embodiment of the present invention, the resistance compensation circuit includes several resistors, several transistors and a register. Each of the resistors is serially connected to one another; each of the transistors connects across one of the corresponding resistors; the register electrically connected to the gates of the transistors controls the switching of the transistors for compensating the resistance variation due to process. In addition, a decoder selectively connected between the gates of the transistors and the register is used to decode the control signal such that the register can control the switching of the transistors through the decoder.

After the resistors of the resistance compensation circuit are connected to an electronic device, the resistances of the resistors in an electronic device and in the resistance compensation circuit are measured after process. Next, a control signal is determined according to the characteristic of the electronic device and the measured resistance is then saved to the register. In addition, the control signal can also be determined with referencing to the working frequency of a memory, such that the working frequency of the electronic device is proportional to the working frequency of the memory.

According to another embodiment of the present invention, a memory device has a memory and a phase-locked loop used to provide a clock, in which the memory stores a first control signal and a second control signal. The phase-locked loop includes a first divider used to divide an input signal to generate a reference signal according to the first control signal; a phase frequency detector, electrically connected to the first divider, used to generate an up signal and a down signal by comparing the phase of the reference signal and a feedback signal; a voltage controlled oscillator, electrically connected to the phase frequency detector, used to tune the frequency of the clock according to the up signal and the down signal; and a second divider, electrically connected between the voltage controlled oscillator and the phase frequency detector, used to generate the feedback signal according to the second control signal and the clock, the feedback signal is provided to the phase frequency detector.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
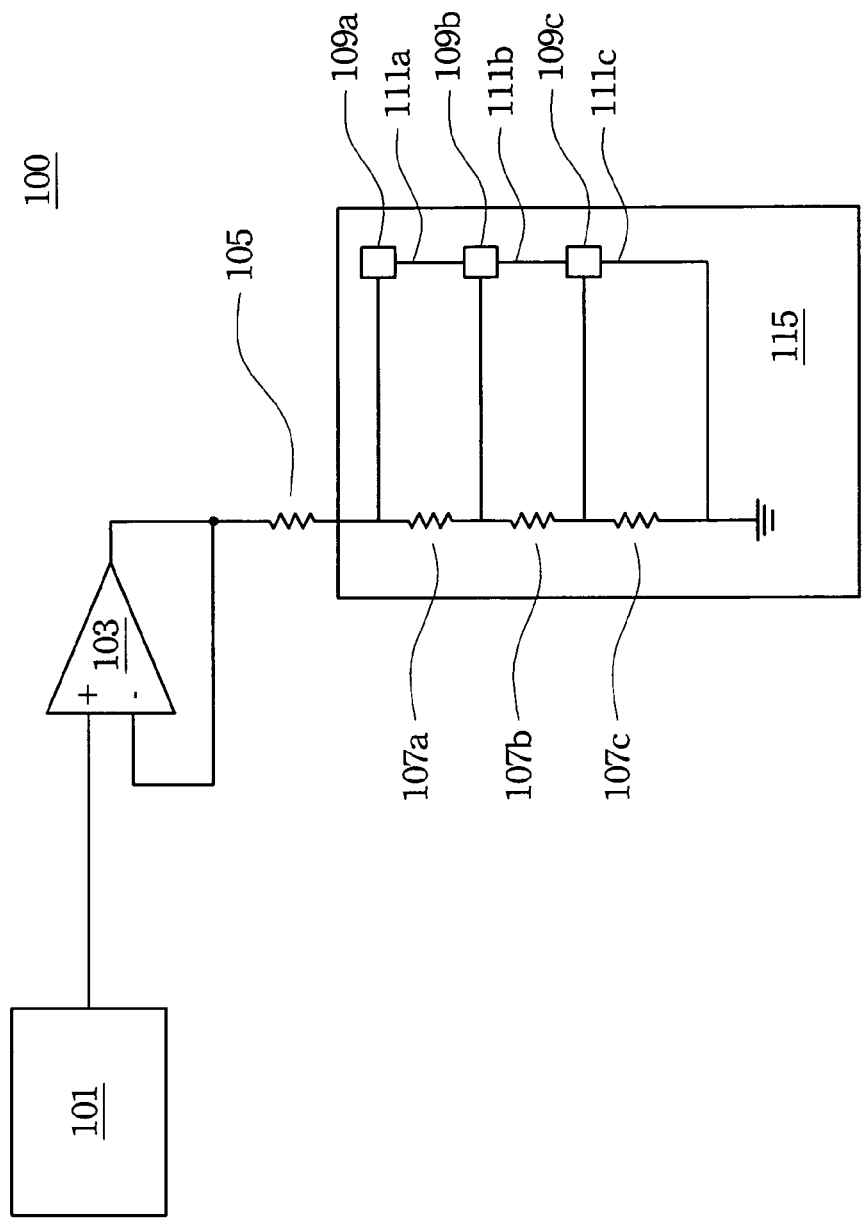
FIG. 1 is a circuit diagram depicting a conventional Integrated circuit.

Reference will now be made in detail to the present embodiments of the invention, examples of which are illustrated in the accompanying drawings. Wherever possible, the same reference numbers are used in the drawings and the description to refer to the same or like parts.

The embodiments of present invention use transistors instead of the trimming pad to choose compensation resistors required to be connected such that the resistance variation due to process can be compensated, therefore, the area required by the integrated circuit which uses the resistance compensation circuit in the embodiments can be reduced, and the equivalent resistance of the integrated circuit will be more precise by adding enough compensation resistors with the proper resistance. Besides, the integrated circuits using the resistance compensation circuit of the embodiments can work with nonvolatile memories of different frequency, so that the working frequency of different nonvolatile memories can be adjustable.

Figure 2:
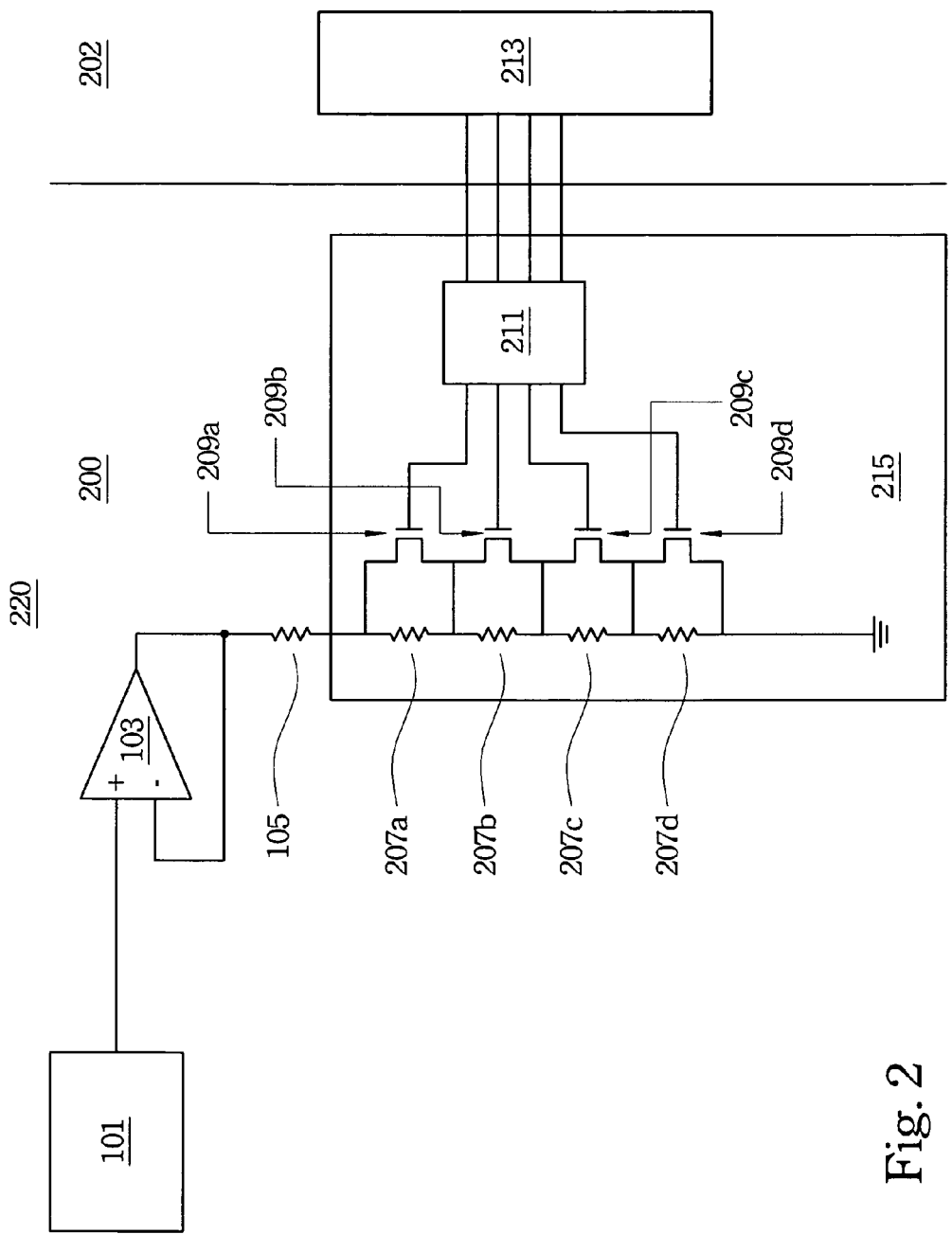
FIG. 2 is a circuit diagram depicting a memory card according to one embodiment of the present invention.

FIG. 2 is a circuit diagram depicting a memory card 220 that incorporates a resistance compensation circuit 215 of the Embodiment of the present invention. The memory card 220 includes a memory controller 200 and a memory 202; the memory 202 includes a control signal storage area 213 which is used to store the control signal; the memory controller 200 includes the resistance compensation circuit 215 of the present invention, a band gap 101, an operation amplifier 103 and an original resistor 105. The resistance compensation circuit 215 includes several compensation resistors 207a, 207b, 207c, 207d, several transistors 209a, 209b, 209c, 209d and a register 211.

The band gap 101 generates the reference voltage for the operation amplifier 103 and is connected to the operation amplifier 103; each of the transistors 209a, 209b, 209c and 209d are connected across one of the corresponding compensation resistors 207a, 207b, 207c and 207d individually.

To get the actual resistance after the process and to compensate the resistor that has resistance variation due to the process, a test measures the resistances of the original resistor 105 and the compensation resistors 207a, 207b, 207c, 207d after the process. The memory card 220 or the test procedure needs to have a formula to generate the control signal with reference to the required resistance (the target resistance of original resistor 105 during circuit design) and the measured resistance of the original resistor 105 and the compensation resistors 207a, 207b, 207c, 207d. After the control signal has been generated by the formula, it will be stored in the control signal storage area 213. When the memory card 220 is being used on a card reader or any other host, the memory controller 200 will get the control signal stored in the control signal storage area 213 and put it into the register 211. The control signal controls the switching of the transistors 209a, 209b, 209c and 209d through the register 211 to compensate for the resistance variation of the original resistor 105 such that the equivalent resistance after compensation is equal to the required resistance of original resistor 105 during circuit design.

For instance, if the required resistance of the original resistor 105 during circuit design is 1000Ω, but the actual measured resistances of the original resistor 105 and the compensation resistors 207a, 207b, 207c, 207d after the processes are 990Ω, 4Ω, 4Ω, 4Ω, 4Ω individually, only compensation resistors 207a and 207b are required to compensate for the resistance variation of the original resistor 105. Therefore, the memory card (or a test machine) writes a control signal into the register 211 to turn off the transistors 209a, 209b and turn on the transistors 209c, 209d, such that the equivalent resistance after compensation will be 990Ω+4Ω+4Ω=998Ω, and the resistance accuracy will be 99.8%.

In the memory controller 200 of the embodiment, decreasing the resistance of each compensation resistor and increasing the number of the compensation resistors can improve the resistance accuracy. For example, the resistance accuracy of the above example can be improved from 98% to 100% if ten 1Ω compensation resistors are used instead of four 4Ω compensation resistors. Accordingly, ten transistors are used instead of four transistors, each of which is connected across one of the 1Ω compensation resistors. The equivalent resistance becomes 990Ω+1Ω×10=1000Ω, so the resolution is 100% now.

In addition, the memory controller 200 of the present invention can be applied to nonvolatile memories with different frequency. For example, when the memory controller 200 is connected to a memory 202 of another frequency, the resistance of the original resistor 105 needs to be changed to another value because the working frequency of the memory controller 200 needs to be tuned to fit the memory 202. To change the resistance, the memory card (or the test machine) needs to generate an new control signal and put it into the control signal storage area 213 of the memory 202, then the working frequency of the memory controller 200 is tuned to fit the memory 202 such that the memory card 220 can work more efficient.

For instance, because the memory controller 200 needs to change it's working frequency to fit the memory 202 of another working frequency, the resistance of the original resistor 105 after the process needs to be changed from 990Ω to 1006Ω. To change the resistance from 990Ω to 1006Ω, the memory card (or test procedure) only needs to write a new control signal into the memory 202 to turn off the transistors 209a, 209b, 209c and 209d, such that the equivalent resistance will be 1006Ω.

According to the embodiment of FIG. 2, the resistance compensation circuit uses transistors instead of trimming pads to select the compensation resistors required, such that the area of the integrated circuit that uses the resistance compensation circuit of the embodiment can be reduced. The memory controller incorporates the resistance compensation circuit of embodiment in FIG. 2 can also be applied to nonvolatile memories of different frequency.

Figure 3:
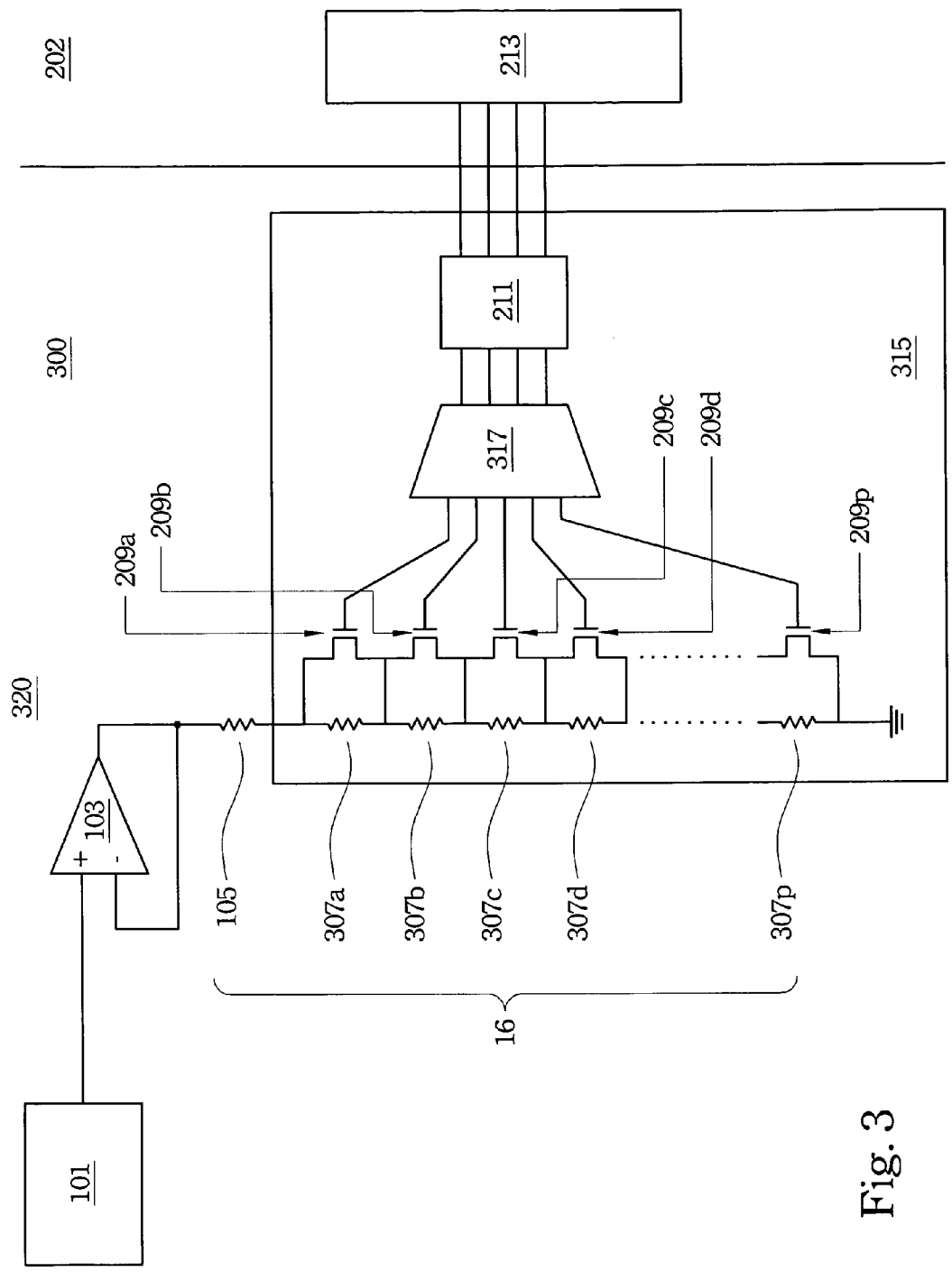
FIG. 3 is a circuit diagram depicting a memory card according to another embodiment of the present invention.

FIG. 3 is a circuit diagram depicting a memory card 320 that incorporates the resistance compensation circuit 315 of the embodiment of the present invention. The memory card 320 includes a memory controller 300 and a memory 202; the memory 202 includes a control signal storage area 213 which is used to store the control signal; the memory controller 300 includes the resistance compensation circuit 315 of the Embodiment, a band gap 101, an operation amplifier 103 and an original resistor 105. The resistance compensation circuit 315 includes several compensation resistors 307a~307p (sixteen compensation resistors), several transistors 209a~209p (sixteen transistors), a decoder 317 and a register 211.

The band gap 101 used to generate reference voltage for the operation amplifier 103 is connected to the operation amplifier 103; each of the transistors 209a~209p are connected across one of the corresponding compensation resistors 307a~308p individually; the decoder 317 is electrically connected to the gates of the transistors 209a~209p, which controls the switching of the transistors 209a~209p; the register 211 is electrically connected to the decoder 317.

The operation of the memory controller 300 is substantially the same as the memory controller 200 in FIG. 2. The difference between FIG. 3 and FIG. 2 is that a decoder 317 connected between the register 211 and the transistors 209a~209p is added to the resistance compensation circuit 315. The decoder 317 is used to control the switching of the transistors 209a~209p. With this decoder 317, the connecting relationship between the output ports of the register 211 and the transistors 209a~209p is no more limited to one to one, which makes it easier to increase the number of compensation resistors/transistors, such that the resolution of the resistance can be improved. For example, if register 211 is a four bit register, the register 211 is only able to control the switching of four transistors without the decoder 317, but it is able to control the switching of sixteen transistors with the decoder 317. In total, the resistance accuracy can be further improved by adding the number of the resistors through adding the decoder 317.

Figure 4:
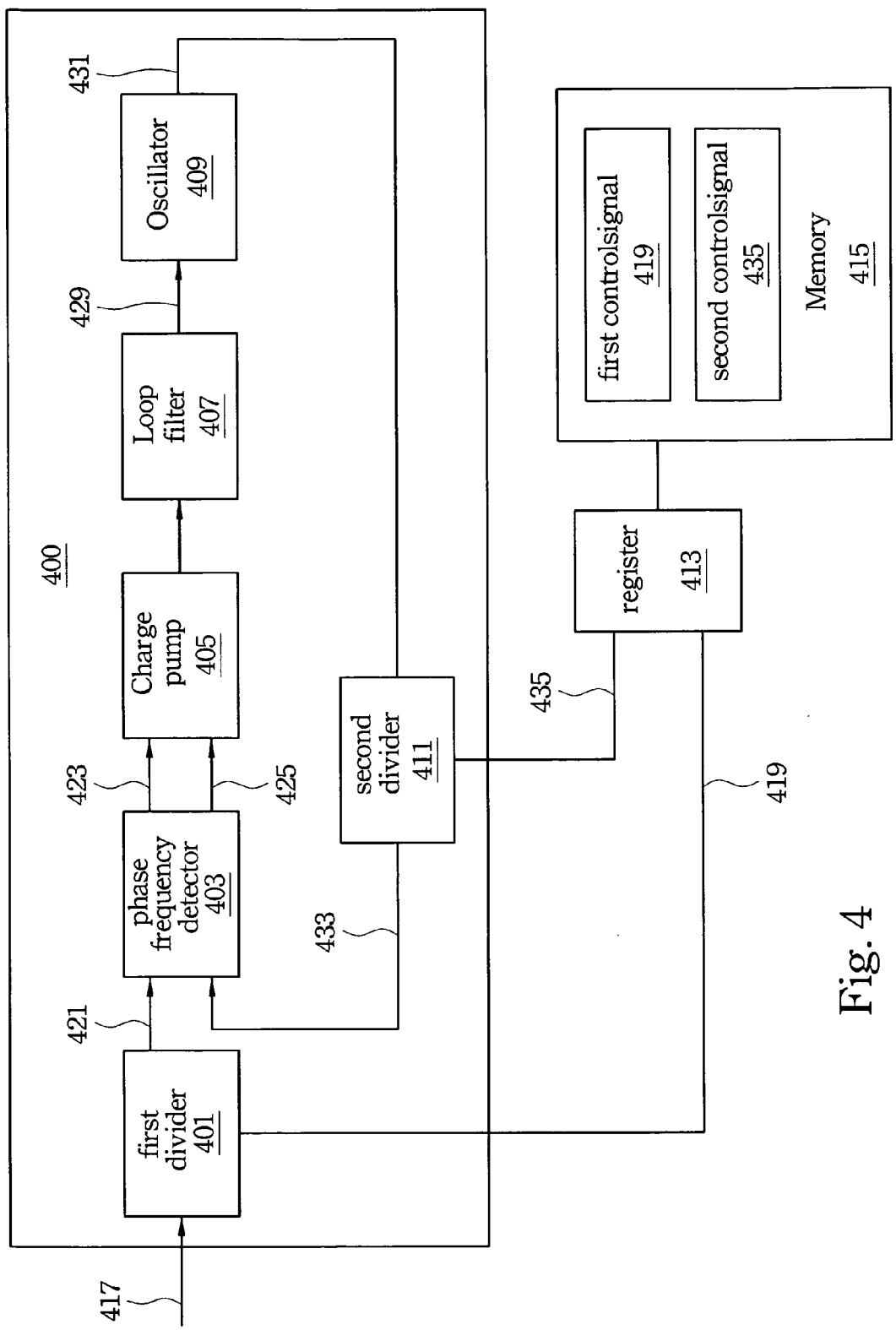
FIG. 4 is a circuit diagram depicting a memory device according to one embodiment of the present invention.

FIG. 4 is a circuit diagram depicting a memory device of another embodiment of the present invention. The memory device, such as a memory card, includes phase-locked loop 400, the register 413 and the memory 415. The register 413 is electrically connected between the memory 415 and the phase-locked loop 400, in which the memory 415 and the register 413 are used to store and provide a first control signal 419 and a second control signal 435 to the phase-locked loop 400. The first control signal 419 and the second control signal 435 are used for tuning the output frequency of the phase-locked loop 400. In other words, the output frequency of the phase-locked loop 400 can be tuned merely by changing the first control signal 419 and the second control signal 435 stored in the memory 415.

The phase-locked loop 400 includes a first divider 401, a phase frequency detector 403, a charge pump 405, a loop filter 407 and a voltage controlled oscillator 409, which are serially connected. The phase-locked loop 400 further includes a second divider 411 electrically connected between the voltage controlled oscillator 409, the phase frequency detector 403 and the register 413. In the phase-locked loop 400, the second divider 411 divides the clock 431 to generate a feedback signal 433; the voltage controlled oscillator 409 generates the clock 431 in view of a control voltage 429; the charge pump 405 charges or discharges the loop filter 407 to generate the control voltage 429.

The first divider 401 generates the reference signal 421 by dividing the input signal 417 in view of the first control signal 419, and then provides the reference signal 421 to the phase frequency detector 403. In other words, the frequency of the reference signal 421 can be tuned by changing the first control signal 419. The phase frequency detector 403 compares the phase of the reference signal 421 and the feedback signal 433, then provides the logic 0 or the logic 1 for the up signal 423 and the down signal 425. The up signal 423 and down signal 425 charges or discharges the loop filter through the charge pump 405, such that a control voltage 429 generated by the loop filter 407 is tuned. As a result, the frequency of the clock 431 is tuned.

If the reference signal 421 leading the feedback signal 433, the phase frequency detector 403 makes the up signal 423 and the down signal 425 logic 1 and logic 0 individually, such that the charge pump 405 makes the loop filter 407 charges continuously until the feedback signal 433 keep up with the reference signal 421.

On the contrary, if the reference signal 421 lags the feedback signal 433, the phase frequency detector 403 makes the up signal 423 and the down signal 425 logic 0 and logic 1 individually, such that the charge pump 405 makes the loop filter 407 discharges continuously until reference signal 421 keeps up with the feedback signal 433.

The frequency of the clock 431 can be changed by writing a different first control signal 419 or a different second control signal 435 to the memory 415 first, then re-initializing the register 413 and the phase-locked loop 400. As a result of the re-initialization, the first divider 401 or the second divider 411 generates the reference signal 421 and the feedback signal 433 of another frequency, which tunes frequency of the clock 431.

The embodiments of the present invention use the transistors instead of the trimming pads, results in reducing the area of the integrated circuit; the resistance accuracy is improved by increasing the compensation resistors; and the working frequency or the clock frequency of the integrated circuit can be tuned to match up the memory of different frequency, which promotes the efficiency of the Integrated circuit.

Any element in a claim that does not explicitly state "means for" performing a specified function, or "step for" performing a specific function, is not to be interpreted as a "means" or "step" clause as specified in 35 USC §112, ¶6. In particular, the use of "step of" in the claim herein is not intended to invoke the provisions of 35 USC §112, ¶6.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A resistance compensation circuit, comprising:
    a plurality of resistors, each of the resistors is serially connected to one another;
    a plurality of transistors, each of the transistors connects across one of the corresponding resistors; and
    a register, electrically connected to the gates of the transistors, for storing a control signal controlling the switching of the transistors, wherein the control signal is determined according to a frequency of a memory, the memory electrically connected to the register.

2. The resistance compensation of claim 1, wherein the memory is used to store the control signal which controls the switching of the transistors through the registers.

3. The resistance compensation circuit of claim 1, further comprising a decoder electrically connected between the gates of the transistors and the register, wherein the decoder is used to decode the control signal such that the register can control the switching of transistors.

4. A method using the resistance compensation circuit of claim 1 to compensate for the resistance variation, comprising:
    connecting the resistors to an electronic device;
    measuring the resistance of the resistors;
    determining the control signal according to the frequency of the memory connected to the electronic device and the resistances of the resistors; and
    saving the control signal to the register,
    wherein the control signal controls the switching of the transistors through the register to compensate for the resistance according to the frequency of the memory connected to the electronic device.

5. The method of claim 4,
    wherein a working frequency of the electrical device is proportional to the frequency of the memory.

6. The method of claim 4, further comprising:
    saving the control signal to the memory,
    whereby the register gets the control signal from the memory.

* * * * *

UNITED STATES PATENT AND TRADEMARK OFFICE
CERTIFICATE OF CORRECTION

PATENT NO. : 7,639,024 B2
APPLICATION NO. : 11/595888
DATED : December 29, 2009
INVENTOR(S) : Te-Wei Chen It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 468 days.

Signed and Sealed this

Twenty-first Day of December, 2010

David J. Kappos
*Director of the United States Patent and Trademark Office*